United States Patent [19]
Yatsuda et al.

[11] 4,264,376
[45] Apr. 28, 1981

[54] METHOD FOR PRODUCING A NONVOLATILE MEMORY DEVICE

[75] Inventors: Yuji Yatsuda, Hachioji; Shinichi Minami, Kokubunji; Ryuji Kondo; Takaaki Hagiwara, both of Kodaira; Yokichi Itoh, Hachioji, all of Japan

[73] Assignee: Hitachi, Ltd., Japan

[21] Appl. No.: 66,795

[22] Filed: Aug. 15, 1979

[30] Foreign Application Priority Data

Aug. 28, 1978 [JP] Japan .................. 53-103946

[51] Int. Cl.³ .......................................... H01L 21/324
[52] U.S. Cl. ..................................... 148/1.5; 148/187
[58] Field of Search ................................ 148/187, 1.5

[56]  References Cited
U.S. PATENT DOCUMENTS

| 3,349,474 | 10/1967 | Rauscher | 148/1.5 X |
| 3,615,942 | 10/1971 | Blumenfeld et al. | 148/187 |
| 3,617,824 | 11/1971 | Shinoda et al. | 148/187 X |
| 4,055,444 | 10/1977 | Ran | 148/1.5 |
| 4,075,045 | 2/1978 | Rideout | 148/187 |
| 4,079,504 | 3/1978 | Kosa | 148/187 X |
| 4,149,307 | 4/1979 | Henderson | 29/571 |
| 4,151,007 | 4/1979 | Levinstein et al. | 148/1.5 |
| 4,151,538 | 4/1979 | Polinsky et al. | 148/187 X |

OTHER PUBLICATIONS

Chen, IEEE Transactions on Electron Devices, vol. Ed-24, No. 5, May 1977, pp. 584-586.

Primary Examiner—G. Ozaki
Attorney, Agent, or Firm—Craig and Antonelli

[57] ABSTRACT

A metal-silicon nitride-silicon oxide-substrate (MNOS) type nonvolatile memory device is disclosed. After the silicon nitride film has been formed, the heat treatment in the hydrogen atmosphere is performed. As a result of this heat treatment, the degradation of the memory retention characteristic is prevented so that a nonvolatile memory device having a silicon gate can be obtained which is comparable to a conventional nonvolatile memory device having an aluminum gate.

18 Claims, 6 Drawing Figures

METHOD FOR PRODUCING A NONVOLATILE MEMORY DEVICE

BACKGROUND OF THE INVENTION

1. FIELD OF THE INVENTION

This invention relates to a method for producing a nonvolatile memory device having an excellent memory retention characteristic.

2. DESCRIPTION OF THE PRIOR ART

In a conventional nonvolatile memory device of metal-nitride-oxide-semiconductor type (nonvolatile memory device of MNOS type), i.e. nonvolatile memory device using a double layer of silicon nitride and silicon oxide as a gate insulating film, aluminum is generally used as gate metal. This is partly because aluminum is easy to work and because the formation of the film thereof is easy so that the process of using aluminum was early realized, but mainly because the process using polycrystalline silicon instead of aluminum could not produce a memory device having a satisfactory memory retention characteristics. Accordingly, the nonvolatile memory device of MNOS type has not yet come to have a silicon gate whereas the standard MOS memory device has had a silicon gate.

Namely, in the process using aluminum as gate metal, the steps involving high-temperature heat treatments such as thermal diffusion treatments for forming a source and a drain are performed before the step of forming a nitride-oxide double film. Accordingly, the state immediately after the formation of the silicon nitride film is kept intact and the quality of the formed film remains almost invariable, so that there is no risk of the memory retention characteristic being adversely affected.

The memory retention in the nonvolatile memory device is defined as the period of time for which a supplied signal can be memorized. In a MNOS type nonvolatile memory device, signals are memorized through the accumulation of electric charges in the interface between the silicon nitride film and the silicon oxide film or in the silicon nitride film by the application of a high voltage to the gate electrode. The memory retention property is the property of retaining the charges in the interface or the silicon nitride film.

There are three parameters which are considered to mainly deteriorate the memory retention property. They are:

(1) the trap density and the trap depth in the interface between the silicon nitride and the silicon dioxide films or in the silicon nitride film, (2) the thickness of the silicon dioxide, and (3) the surface state in the interface between the silicon substrate and the silicon dioxide film.

Of these parameters, the first is concerned with the rate of loss of the stored charges due to thermal excitation, and the second and the third affect the rate of the escape of the stored charges into the surface of the silicon substrate through back tunneling. As described before, in the case where aluminum is used as a gate electrode, a high-temperature heat treatment is not performed after the formation of the silicon nitride film so that the above parameters are all kept invariable, therefore, the memory retention property is never deteriorated.

In order to improve the packing density and the occupying rate in a MNOS type nonvolatile memory device and to further the performance thereof, the memory device must be fabricated by using as gate metal polycrystalline silicon, refractory metals such as Mo, W, Ta, Ti, Cr, Ni, etc. or their alloys or silicon compounds through a self-aligning process.

In the self-aligning process using polycrystalline silicon etc. for a gate electrode, a gate is formed and then a source and a drain are formed with the gate being used as a mask, therefore a high-temperature heat treatment is necessary after the formation of the gate electrode.

In the conventional fabrication process using polycrystalline silicon for gate electrode, such a high-temperature heat treatment after the formation of the gate electrode is usually performed in the atmosphere of nitrogen or oxygen. According to this conventional process, the above-mentioned parameters are varied and therefore the memory characteristic is always deteriorated. Thus, according to the conventional process, it was very difficult to fabricate a nonvolatile memory device having a high quality using polycrystalline silicon as gate metal.

SUMMARY OF THE INVENTION

One object of this invention is to eliminate the above problems incidental to the conventional silicon gate process and to provide a method for producing a nonvolatile semiconductor memory device having a high quality.

Another object of this invention is to provide a method for producing a nonvolatile semiconductor memory device using polycrystalline silicon or such refractory metals as mentioned above as a gate metal, without causing the deterioration of the memory characteristic.

Yet another object of this invention is to provide a method for forming a source and a drain in a nonvolatile semiconductor memory device without any deterioration of the memory characteristic.

According to this invention, which has been made to attain the above objects, after the silicon nitride film which serves as a gate insulating film has been formed on the silicon dioxide film, a heat treatment in an atmosphere including hydrogen is performed.

Preferably, the temperature of the heat treatment in a hydrogen including atmosphere is not lower than a temperature about 100° C. lower than the temperature of any heat treatment in a non-hydrogen atmosphere.

DESCRIPTION OF THE PREFERRED EMBODIMENTS

Figure 1A:
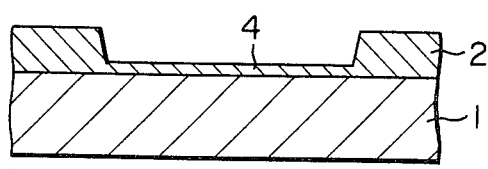
FIGS. 1A to 1C show in cross section the steps of the process as an embodiment of this invention.

The cause of the deterioration of the memory retention characteristic due to the change in the above mentioned parameters in the case where a high-temperature heat treatment is performed after the silicon nitride film has been deposited on the silicon dioxide film, is not clear, but it has been revealed that the memory retention characteristic of a MNOS type nonvolatile memory device depends largely on the atmosphere in which the heat treatment is to be performed.

Namely, the Inventors have found the following facts affecting the memory retention characteristic.

(1) The electrical conductivity of the silicon nitride film depends largely on the content of hydrogen in the silicon nitride film; the conductivity decreases considerably with the increase in the content of hydrogen.

(2) The surface state in the interface between the silicon substrate and the silicon dioxide film is lowered as a result of the heat treatment in the hydrogen atmosphere.

The above fact (1) assures that the stored charges are prevented from being lowered in quantity owing to thermal excitation and the fact (2) guarantees that the stored charges are prevented from flowing into the silicon substrate through tunnel effect.

Therefore, if the surface state in the interface between the silicon substrate and the silicon dioxide film is lowered by the heat treatment in hydrogen performed after the deposition of the silicon nitride film and if the content of hydrogen in the silicon nitride film is increased, the deterioration of the memory characteristic can be completely prevented so that a MNOS type nonvolatile memory device having a high quality is produced. This invention has been made under the above consideration and if the heat treatment is performed in the atmosphere other than hydrogen, no effect of preventing the deterioration of the memory retention characteristic can be obtained. For example, the memory characteristic is considerably degraded if the heat treatment is performed in an oxidizing atmosphere such as air or oxygen, and also in an atmosphere of nitrogen, argon or carbon monoxide. The only atmosphere useful to prevent the deterioration of the memory characteristic is hydrogen.

The temperature at which sufficient hydrogen atoms can be diffused into the silicon nitride film, i.e. temperature for hydrogen treatment for providing an excellent memory retention, depends on the temperature at which the silicon nitride film is formed and the temperature at which the heat treatment in an atmosphere other than hydrogen is performed for the formation of a drain and a source. For example, when the deposition temperature at which the silicon nitride film is formed by the chemical vapor deposition (CVD) method is about 800° C. and the source and the drain or a PSG film are formed at such temperatures, the deterioration of the memory retention characteristic can be effectively prevented if the heat treatment is performed in an atmosphere of hydrogen kept at temperatures not lower than about 700° C. However, in the case where the silicon nitride film, etc., are formed under a higher temperature, for example, 1100° C., the effect of preventing the deterioration of the memory retention characteristic is not satisfactory if the temperature of the heat treatment in hydrogen is 700° C. Therefore, the temperature of the heat treatment must be raised higher to obtain a satisfactory result. Namely, if the temperature for heating in the non-hydrogen atmosphere is not higher than about 1000° C., the temperature of the heat treatment in the hydrogen atmosphere may be chosen to be not lower than about 700° C.; and if the temperature $T_A$ for heating in the non-hydrogen atmosphere is not lower than about 1000° C., the temperature $T_H$ of the heat treatment in the hydrogen atmosphere must be such that $T_H \geq T_A - 100 (° C.)$.

In the usual formation of a MNOS type nonvolatile memory device, after the silicon nitride film has been formed, the gate is formed and then the source, the drain and the phosphosilicate glass (PSG) film, serving as a passivation film, are formed. A heat treatment in the atmosphere of nitrogen or oxygen is very often performed in, before or after the formation of the source, drain and PSG film. In this case, the temperature of the heat treatment in the hydrogen atmosphere must be determined on the basis of the highest temperature at which the heat treatments in the non-hydrogen atmosphere are performed, as in the formation of the silicon nitride film, the source or drain. It is most preferable to perform the heat treatment in the hydrogen atmosphere after the completion of all the heat treatments in the non-hydrogen atmosphere. If this order of the heat treatments is kept, the memory retention characteristic can be improved, the PSG film is made denser, ions are activated and so on. On the other hand, in the case where the temperature of the heat treatment in the non-hydrogen atmosphere is lower than that of the heat treatment in the hydrogen atmosphere, the above mentioned order of the heat treatments may often be inverted without causing any practical problems.

This invention will now be described by way of embodiments.

EMBODIMENT 1

FIG. 1 shows the steps of a fabrication process as an embodiment of this invention. As shown in FIG. 1A, a silicon dioxide film 2 for the isolation of active device regions was grown on a silicon substrate 1 of p-type having a (100) plane. A desired portion of the SiO₂ film 2 was removed by the well-known photoetching technique. Thereafter, a thin silicon dioxide film 4 having a thickness of about 2 nm was formed on the exposed surface of the substrate 1 through the thermal oxidation process under the conditions of a $O_2/N_2$ dilution ratio of $10^{-4}$ and of a temperature of 900° C.

Figure 1B:
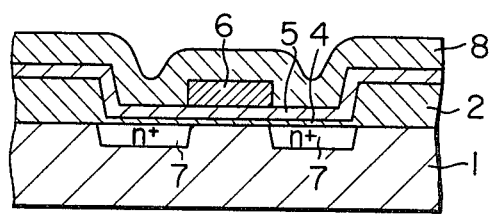

With a ratio $SiH_4/NH_3$ of $10^{-2}$ and under a temperature of 800° C., a silicon nitride film 5 having a thickness of about 50 nm was deposited, as shown in FIG. 1B, through a vapor growth technique. Also through the well-known vapor growth technique, a polycrystalline silicon film 6 was deposited and then the film 6 was selectively etched away leaving a portion thereof serving as a gate.

Phosphorus atoms (ions) were implanted through the silicon nitride film 5 into the silicon substrate 1 (with an acceleration energy of 100 KeV and a concentration of $1 \times 10^{16}/cm^2$) to form n+ diffusion regions, i.e. self-aligned source and drain regions, 7. In this case, the polycrystalline silicon film 6 was also doped heavily with phosphorus atoms. After a PSG film 8 had been deposited over all the surface thus prepared, through the well-known CVD method, a heat treatment in an atmosphere of hydrogen at a temperature of 900° C. was performed for 30 minutes so as to improve the memory retention characteristic of the resultant memory device, to activate the implanted ions and to make the PSG film denser.

Figure 1C:
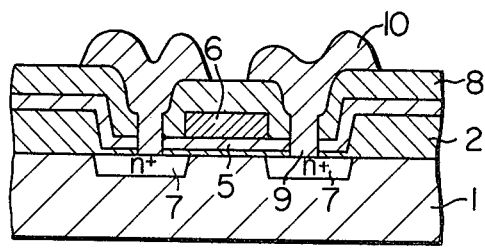

After contact holes 9 had been cut as shown in FIG. 1C, wiring layers 10 were formed by the deposition of aluminum film and the succeeding selective photoetching. The remaining steps of fabrication were the same as those for producing a usual MOS device and a MNOS type nonvolatile memory device was thus completed.

Figure 2:
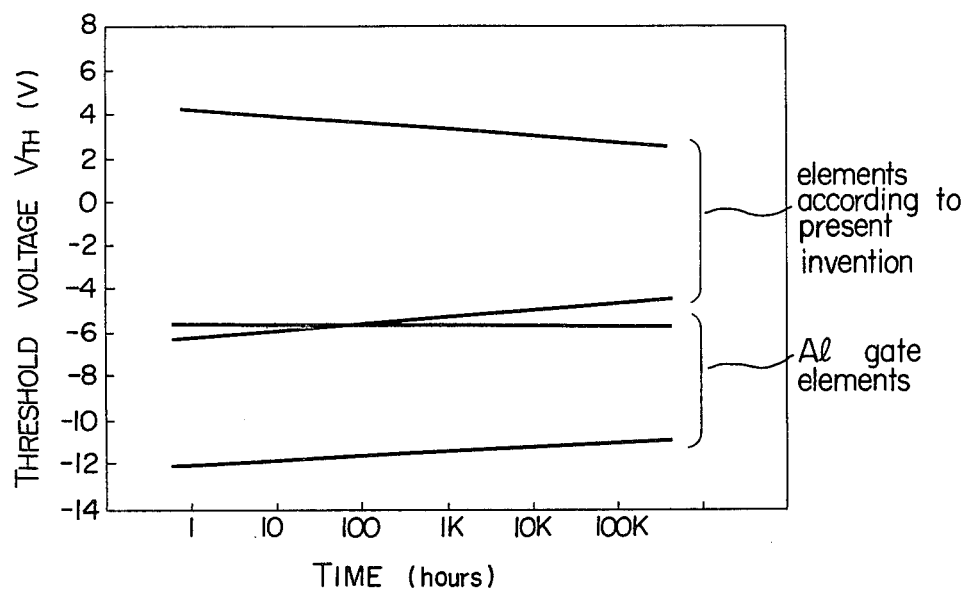
FIGS. 2 and 3 are graphical representations illustrating the effects attained according to this invention.

The memory retention characteristic of the resultant device is as shown in FIG. 2, that is, it is comparable to the best of the memory retention characteristics of the conventional MNOS type nonvolative memory device using aluminum as its gate metal.

EMBODIMENT 2

This embodiment is the same as the embodiment 1 up to the step of forming the gate 6 of polycrystalline silicon is reached. Thereafter, with the gate 6 of polycrystalline silicon used as a mask, the exposed portion of the silicon nitride film 5 was etched away. The polycrystalline silicon layer 6 was then doped with phosphorus through the thermal diffusion of phosphorus at 900° C. for 30 minutes and n+ type diffusion regions, i.e. self-aligned source and drain regions, 7 were formed in the surface region of the p-type silicon substrate 1. An oxidation process for preventing the degradation of the gate breakdown voltage was performed at 850° C. for 20 minutes. As a result, a silicon dioxide film, 200 nm thick, was formed, covering the n+ diffused regions 7 and the polycrystalline silicon layer 6. A phosphosilicate glass film 8 was deposited through vapor growth. After the memory retention characteristic has been improved by a heat treatment in hydrogen atmosphere at 900° C. for 30 minutes, wiring layers 10 were formed. Thereafter, a MNOS type memory device was completed by using the steps similar to those employed in the embodiment 1. The memory retention characteristic of the device thus prepared was the same as that of the device fabricated according to the embodiment 1. It is the memory retention characteristic in the negative region that can be improved by the heat treatment in the hydrogen atmosphere.

If the decay rate M of the threshold voltage with the logarithm of time is used as a parameter for representing the memory retention characteristic such that $$M = \partial Vth/\partial \log t,$$

where Vth is the threshold voltage of the MNOS type memory device and t is the memory retention time, then the decay rate M should preferably be equal to or less than 0.3 so as to obtain a retention time t of about 10 years if $|Vtho| \simeq 4V$, Vtho being the value of the threshold voltage immediately after a writing or erasing operation.

Figure 3:
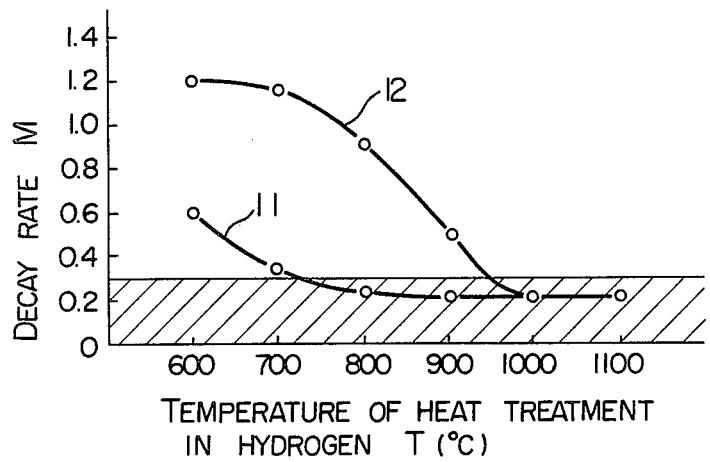

When a heat treatment affecting the quality of the silicon nitride film was not performed before the heat treatment in the hydrogen atmosphere after the formation (deposition) at 800° C. of the silicon nitride film (about 50 nm thick) on the silicon dioxide film (about 2 nm thick), the decay rate M was rendered not more than about 0.3 by the heat treatment in hydrogen at temperatures not lower than about 700° C., as shown by a curve 11 in FIG. 3. This means that a good memory retention characteristic had been obtained. Further, when the quality of the silicon nitride or dioxide film was changed, a remarkable effect of the heat treatment in hydrogen was observed. However, when a heat treatment in nitrogen at 1050° C. for 20 minutes was performed before the heat treatment in hydrogen, M could not be rendered not more than 0.3 without a heat treatment at temperatures not lower than 950° C. which is 100° C. lower than the temperature of the heat treatment in nitrogen, as apparent from a curve 12 in FIG. 3, even though the temperature at which the silicon nitride film had been grown was kept at the same temperature 800° C.

As described before, the physical effect of the heat treatment in hydrogen is the lowering of the surface state in the interface between the thin silicon dioxide film and the silicon substrate and the reduction of the electric conductivity of the silicon nitride film.

In the case where M was rendered equal to or less than 0.3 as a result of the heat treatment in hydrogen, the concentration Nss of the surface states in the center of the silicon band was measured by the quasi-static method. The result of the measurement was that $Nss \leq 10^{12}$ cm$^{-2}$. Also, in this case, the conductance of the silicon nitride film was lowered. For example, when the silicon nitride film formed at 800° C. was heated at 1050° C. for 20 minutes in nitrogen, the conductance of the silicon nitride film was 10 times the value of the conductance assumed by the film immediately after the formation thereof. On the other hand, when the same film was heated again in hydrogen at 1000° C. for 20 minutes, the conductance was restored to its initial value immediately after the formation of the film. This is the manifestation of the effect of the heat treatment in hydrogen.

It should be further noted that though the characteristic curves shown in FIG. 3 represent effects of heat treatment in a hydrogen atmosphere for 20 minutes, these effects are almost the same even if the length of time for the heat treatment is made longer, e.g., as long as one hour or so.

EMBODIMENT 3

This embodiment was the same as the embodiment 1 up to the steps of depositing the PSG film 8 and cutting contact holes 9 except that the heat treatment in a hydrogen atmosphere was not effected. Then, the thus prepared structure was heated at 1000° C. for 20 minutes in a hydrogen atmosphere. After the exposed surface of the silicon substrate and the surface of the polycrystalline silicon layer had been slightly etched, wiring layers of aluminum 10 were formed to establish electrical contact with them. Accordingly, the surfaces to be kept in contact with the wiring layers 10 were cleaned so that the failure in contact could be prevented to a considerable extent.

EMBODIMENT 4

Figure 4:
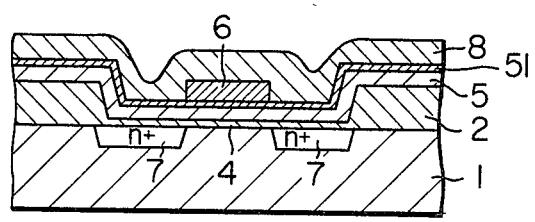
FIG. 4 shows in cross section another embodiment of this invention.

After a silicon dioxide film 2 for the isolation of active device regions had been grown on a p-type silicon substrate 1 having a (100) plane, as shown in FIG. 4, a desired portion of the film 2 was etched away to form a thin film 4 of silicon dioxide having a thickness of about 2 nm on the exposed surface. Then, a silicon nitride film 5, about 50 nm thick, was grown through low-pressure vapor growth technique. The film 5 was grown with a SiH$_2$Cl$_2$/NH$_3$ ratio of 1/10 at a temperature of 800° C.

The thus prepared structure was subjected to an oxidation treatment at 1000° C. for about 3 hours in an atmosphere of wet oxygen and a silicon dioxide film 51, about 10 nm thick, was grown on the silicon nitride film 5. Through vapor growth, a polycrystalline silicon film 6, about 0.6 μm thick, is deposited on the entire surface of the silicon dioxide film 51. That part of the polycrystalline silicon film 6 which serves as a gate was left unremoved after the selective photoetching of the film 6. Arsenic ions were implanted through the silicon nitride film 5 into the substrate 1, with an implanting energy of 175 KeV and an implanting concentration of $1 \times 10^{16}$ cm$^{-2}$. As a result, n+ diffused regions, i.e, self-aligned source and drain regions, 7 were formed and simultaneously the gate layer 6 was doped with arsenic.

After a PSG film 8 had been formed over the entire surface thus treated, a heat treatment in an atmosphere of hydrogen was performed at 900° C. for 30 minutes so as to activate the implanted arsenic ions, to make the PSG film 8 denser and to improve the memory retention characteristic. Thereafter, as in the embodiment 1, contact holes were cut and metallizing layers were formed. Further, the thus prepared structure was treated by the usual process for fabricating a MOS device and a MNOS type nonvolatile memory device was completed.

EMBODIMENT 5

A MNOS type nonvolatile memory device was fabricated according to the same steps of a process as used in the embodiment 4. The only difference was as follows; the thickness of the silicon dioxide film 51 was 3 nm, the implanted ions were of phosphorus, and the temperature of the heat treatment in hydrogen was 750° C.

This is a typical process with a modified heat treatment. It is apparent that the same result can be obtained even if some of the intervening steps are slightly modified.

Although the foregoing description has been directed to the formation of an n-channel nonvolatile memory device using a p-type silicon substrate, this invention is by no means limited to the embodiments described above, but can also be applied to the fabrication of a p-channel memory device using an n-type substrate. Namely, according to this invention, a p-channel memory device of MNOS type can also be fabricated without degradation of the memory retention characteristic. Moreover, according to this invention, a satisfactory result can be obtained even in the case where a well or an epitaxial layer is utilized or where a MNOS structure and a MOS (MIS) structure are simultaneously formed.

Further, in the above embodiments, the hydrogen atmosphere used in the heat treatment may be replaced by an atmosphere composed of hydrogen and inert gas, to obtain the same result.

As described above, according to this invention, even in the case where a high-temperature heat treatment is needed after the formation of the silicon nitride film in the fabrication of a MNOS type nonvolatile memory device, the produced memory device can have an excellent memory retention characteristic. Therefore, the source and the drain can be effectively formed in a self-aligning manner with the gate used as a mask so that memory devices having an excellent memory retention characteristic can be formed with a high packing density.

In this invention, the effect of the heat treatment in the hydrogen atmosphere will increase with the temperature of the heat treatment, but a heating apparatus for generating very high temperatures is very expensive and moreover too high temperatures cause the silicon dioxide film to be reduced to silicon proper. This reduction deteriorates the device characteristics. For this reason, the upper limit to the temperature of the heat treatment in the hydrogen atmosphere is about 1200° C. and a heat treatment at higher temperatures should be avoided.

We claim:

1. A method of producing a nonvolatile memory device of a metal-nitride-oxide-semiconductor type, comprising the steps of:
forming a gate insulating film on a semiconductor substrate by forming a silicon dioxide layer on the substrate and then forming a silicon nitride layer on the silicon dioxide layer;
depositing a gate electrode on said gate insulating film;
forming a source and a drain in a surface region of said semiconductor substrate;
forming a protective or passivation film on the entire resulting surface; and
effecting a heat treatment of the substrate after the insulating film is formed thereon in an atmosphere including hydrogen.

2. A method as claimed in claim 1, wherein said gate electrode is made of a material selected from the group consisting of polycrystalline silicon and a refractory metal.

3. A method as claimed in claim 2, wherein said refractory metal is selected from the group consisting of Mo, W, Ta, Ti, Cr, Ni alloys and silicon compounds thereof.

4. A method as claimed in claim 2 or 3, wherein said source and drain are formed in a self-aligning manner with said gate electrode used as a mask.

5. A method as claimed in claim 1, 2 or 3, wherein said heat treatment in said hydrogen including atmosphere is performed before said protective film is formed.

6. A method as claimed in claim 1, 2 or 3, wherein said heat treatment in said hydrogen including atmosphere is performed after said protective film has been formed.

7. A method as claimed in claim 1, 2 or 3, wherein said heat treatment in said hydrogen including atmosphere is performed at temperatures ranging from about 700° C. to about 1200° C.

8. A method as claimed in claim 1, 2 or 3, wherein said heat treatment in said hydrogen including atmosphere is effected at a temperature not lower than a temperature which is about 100° C. lower than a temperature of any heat treatment of the method in a non-hydrogen atmosphere and an upper limit to said temperature of said heat treatment in said hydrogen including atmosphere is about 1200° C.

9. A method as claimed in claim 8, wherein the heat treatment in an atmosphere including hydrogen is effected after any other heat treatments in a non-hydrogen atmosphere.

10. A method as claimed in claim 1, 2 or 3, wherein said gate insulating film consists of a silicon dioxide film and a silicon nitride film.

11. A method as claimed in claim 1, 2 or 3, wherein said gate insulating film includes a second layer of silicon dioxide formed on the silicon nitride layer.

12. A method as claimed in claim 1, 2 or 3, wherein the heat treatment in the hydrogen including atmosphere is at a temperature greater than any heat treatment of the method in a non-hydrogen atmosphere.

13. A method of producing a nonvolatile memory device of a metal-nitride-oxide-semiconductor type, comprising the steps of:
(a) forming a silicon dioxide film on a semiconductor substrate,
(b) removing a portion of the silicon dioxide film to expose the substrate,
(c) forming a silicon dioxide film on the exposed surface of the substrate,
(d) forming a silicon nitride film on the silicon dioxide film, (e) forming a refractory film on the silicon nitride layer,
(f) etching a portion of the refractory film to form a gate,
(g) forming a source and drain in the surface region of the semiconductor substrate,
(h) forming a protective film over any exposed surface of the substrate and films thereon, and
(i) heat treating the substrate having at least the silicon nitride film formed thereon in an atmosphere including hydrogen, said heat treating being effected at a temperature of not less than about 700° C. when any heat treatment of the method in a non-hydrogen atmosphere is not more than 1000° C. and being at a temperature not lower than a temperature which is about 100° C. less than or equal to a temperature of any heat treatment of the method in a non-hydrogen atmosphere when the heat treatment of the method in a non-hydrogen atmosphere is higher than 1000° C., the heat treatment in the atmosphere including hydrogen being less than about 1200° C.

14. A method as claimed in claim 13, wherein between steps (f) and (g) the silicon nitride layer is etched by using the gate as a mask.

15. A method as claimed in claim 13, wherein between steps (g) and (h) a silicon dioxide film is formed over the gate and source and drain regions.

16. A method as claimed in claim 13, wherein between steps (d) and (e) an additional film or silicon dioxide is formed on the silicon nitride film.

17. A method as claimed in claim 13, wherein step (i) is performed after step (d).

18. A method as claimed in claim 1, 2, 3 or 13, wherein the protective or passivation film comprises phosphosilicate glass.

* * * * *